United States Patent [19]
Goosen et al.

[11] Patent Number: 5,605,856
[45] Date of Patent: Feb. 25, 1997

[54] METHOD FOR DESIGNING AN ELECTRONIC INTEGRATED CIRCUIT WITH OPTICAL INPUTS AND OUTPUTS

[75] Inventors: Keith W. Goosen, Aberdeen, N.J.; Fouad E. Kiamilev, Charlotte, N.C.; Ashok V. Krishnamoorthy, Middletown, N.J.; David A. B. Miller, Fair Haven, N.J.; James A. Walker, Howell, N.J.

[73] Assignees: University of North Carolina, Charlotte, N.C.; Lucent Technologies Inc., Murray Hill, N.J.

[21] Appl. No.: 403,316

[22] Filed: Mar. 14, 1995

[51] Int. Cl.$^6$ ............................................. H01L 21/768
[52] U.S. Cl. .................... 437/51; 437/5; 437/57; 437/195
[58] Field of Search ........................... 437/5, 51, 57, 437/129, 189, 195

[56] References Cited

U.S. PATENT DOCUMENTS

| | | | |
|---|---|---|---|
| 4,734,380 | 3/1988 | Tsong | 437/51 |
| 4,984,861 | 1/1991 | Suchoski, Jr. et al. | 437/51 |
| 5,191,219 | 3/1993 | Linke | 250/551 |
| 5,328,853 | 7/1994 | Huber et al. | 437/5 |
| 5,339,090 | 8/1994 | Croosland et al. | 345/90 |
| 5,375,180 | 12/1994 | Murphy | 437/51 |
| 5,385,632 | 1/1995 | Goosen | 156/630 |
| 5,389,776 | 2/1995 | Woodward | 250/214 |

Primary Examiner—Chandra Chaudhari
Attorney, Agent, or Firm—Brian K. Dinicola

[57] ABSTRACT

A method for designing an integrated circuit having optical inputs and outputs includes the step of selecting an integrated circuit design which includes at least one circuit cell design for processing electric signals. The circuit cell design has a predetermined number of electric inputs and electric outputs. The integrated circuit design also includes a plurality of layers of metalization for providing electric coupling. After the electronic integrated circuit design is selected, a predetermined number of optical input devices are located on the circuit cell design in a first prearranged orientation. The predetermined number of optical input devices is no greater than the predetermined number of electric inputs to the circuit cell. Also after the electronic circuit design is selected, a predetermined number of optical output devices are located on the circuit cell design in a second prearranged orientation. The predetermined number of optical output devices is no greater than the predetermined number of electric outputs to the circuit cell. At least a topmost layer of metalization is selected for electrically coupling each optical input device to a distinct one of the electric inputs of the circuit cell and for electrically coupling each optical output device to a distinct one of the electric outputs of the circuit cell. Finally, the completed design for the integrated circuit with optical inputs and outputs is recorded in a memory such as an electronic storage medium.

25 Claims, 3 Drawing Sheets

FIG.1A
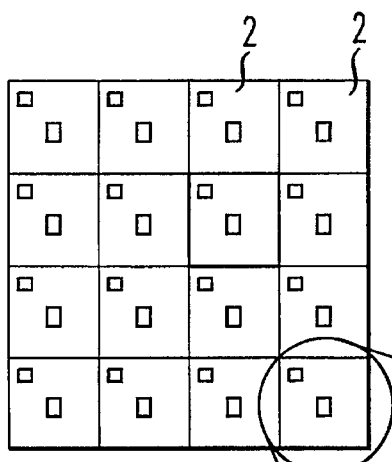
FIG.1B
MODULATOR 6 &
MODULATOR DRIVER CIRCUIT 7
PHOTODETECTOR 4 &
RECEIVER CIRCUIT 5
LOGIC AND MEMORY
CIRCUITRY 3
FIG.4
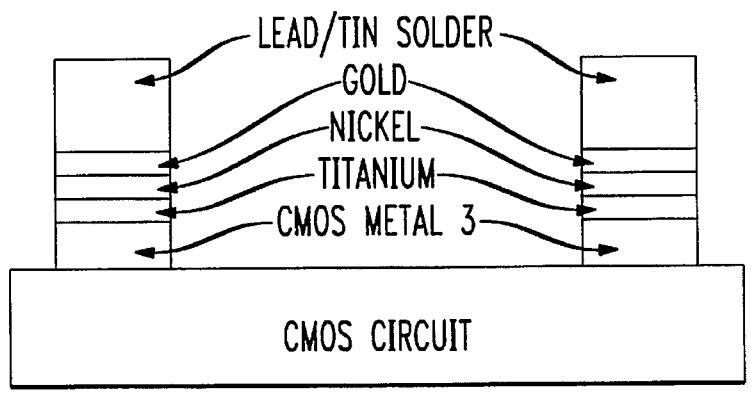

METHOD FOR DESIGNING AN ELECTRONIC INTEGRATED CIRCUIT WITH OPTICAL INPUTS AND OUTPUTS

The present invention relates generally to electronic integrated circuits and more particularly to electronic integrated circuits having optical inputs and outputs.

BACKGROUND OF THE INVENTION

The tremendous progress in high performance Very-Large Scale Integrated (VLSI) circuit technology now allows several million transistors to be incorporated onto a single silicon chip with on-chip clock rates as high as 200 Mega-Hertz (MHz). By the end of the decade, the integration density for silicon Complementary Metal Oxide Semiconductor (CMOS) technology is expected to be over 20 million transistors with a projected on-chip clock rate of 500 MHz. The enormous bandwidth that will be available for computation and switching on a silicon integrated circuit will create a huge bottleneck for the Inputs and Outputs (I/Os) that serve as interconnects to the VLSI circuit. Currently, the most widely used interconnect technique involves placing the I/Os along the periphery of the integrated circuit. A simple perimeter-versus-area calculation shows that the number of transistors per I/O channel will continue to increase, leading to an I/O performance bottleneck. In practice, off-chip clock rates are usually much smaller that on-chip clock rates, increasing the demands placed on the I/Os even further. Thus, a means of incorporating high-performance I/Os in a silicon chip is needed to fully exploit the tremendous computational capabilities of current and future VLSI circuits.

Optical I/Os can overcome this bottleneck because of their greater bandwidth, immunity from crosstalk and signal interference. Additionally, optical I/Os can be fabricated in large, high density arrays. Optical I/Os have been used as interconnects for integrated circuits to form "smart pixels." An example of a smart pixel array is shown in FIG. 1. The array includes a plurality of individual smart pixels 2 arranged in a symmetric manner. Each smart pixel includes an electronic circuit cell 3, a photodetector 4 with an associated receiver circuit 5 and a modulator 6 with an associated modulator driver circuit 7. The circuit cell comprises related electronic circuitry that processes the electrical signal received at one or more of its inputs and produces an electrical signal at one or more of its outputs. The electronic circuit cell has a predefined number of electrical inputs and outputs. The particular nature of the circuit cell depends on the type of electrical processing it is to perform. Some common examples of a circuit cell include random-access memories, arithmetic logic units, and high-speed multipliers or even an entire VLSI chip. In the case of a conventional smart pixel array, the circuit cell is usually a simple logic circuit with about 100 transistors. The photodetector 4 and its associated receiver circuit 5 serve as the optical input that converts an optical input signal to an electrical input signal. The photodetector 4 first converts the optical input signal to a photocurrent. The receiver circuit 5 then converts the photocurrent to an appropriate voltage compatible for use as the electrical input to the circuit cell. The modulator 6 and its associated modulator driver circuit 7 serve as the optical output that converts an electrical output signal from the circuit cell to an optical output signal. The modulator driver circuit 7 receives the electrical output signal from the circuit cell 3 and converts it to a voltage that is applied to the modulator 6. The modulator 6 varies the intensity of an optical beam in proportion to the voltage applied to it. The optical beam thus modulated by the modulator 6 serves as the optical output signal. The photodetectors and modulators are typically reverse-biased diode devices.

The design of a smart pixel array proceeds as follows. First, the location of all the photodetectors and modulators on the entire integrated circuit is selected. The photodetectors and modulators are positioned so that they form a regular array. Such an arrangement is important because the optical input signals are usually generated by an external optical system that can most conveniently transmit the optical information to all the photodetectors as a series of parallel optical signals that are transmitted in a spatially symmetric manner. If the photodetectors were arranged in an irregular or asymmetric fashion, the complexity of the required optical system would be greatly increased. These same considerations apply to the modulators, which transmit the optical output signals to an external optical receiver that most conveniently receives the signals in a symmetric manner. After the location of the photodetectors and modulators have been determined, the layout of the entire electronic integrated circuit is performed. That is, the integrated circuit is partitioned into a series or array of circuit cells that in the case of smart pixels are referred to as pixels. Next, the particular location and size of each electronic component (e.g., transistor, capacitor and interconnection line) in a given pixel is determined. Since all the pixels in a smart pixel array are substantially identical, once the design of a single pixel have been completed, it may be replicated for the remaining pixels.

As detailed above, the electronic integrated circuit in a smart pixel array is not designed independently of the optical I/Os. That is, the smart pixel design process preselects the location of the photodetectors and modulators prior to designing the electronic integrated circuit. This places severe constraints on the design of the electronic integrated circuit, limiting the designer's flexibility in sizing and locating the transistors and interconnection lines. Thus, for example, the maximum level of complexity of each circuit cell (i.e., pixel) is typically dictated by the available area between the predetermined location of the photodetectors and modulators. Due to these constraints placed on the design of a smart pixel array, the circuit cells in the array are typically limited to low levels of complexity, are homogeneous relative to one another, and have limited electrical communication with one another.

Optical I/Os for integrated circuits other than those used in smart pixel arrays is problematic. In general, an integrated circuit contains numerous circuit cells that are highly complex and non-homogeneous in terms of both their function and in terms of the number of electronic components such as transistors and interconnects that they employ. As a result, the constraints imposed on electronic integrated circuits which are designed by the previously-described design procedure prevent such complex integrated circuits from being supplied with optical I/Os.

SUMMARY OF THE INVENTION

The inventive method allows optical I/Os to be used in integrated circuits that contain a wide variety of different and highly-complex circuit cells, even when those circuit cells are arranged in a spatially asymmetric manner. Moreover, there is no need to substantially redesign conventional electronic circuits so as to be compatible with the optical I/Os. In contrast to the methods used to design smart pixels, the inventors have realized that by reserving a topmost layer of metalization for electrically interconnecting the optical I/Os, the electronic integrated circuit may be designed without taking into account the location of the optical I/Os on the integrated circuit. Accordingly, the designer has as much flexibility available in designing an electronic integrated circuit with optical I/Os as is available when no optical I/Os are provided.

In accordance with the inventive method, an electronic integrated circuit design is selected which includes at least one circuit cell design for processing electric signals. The circuit cell design has a predetermined number of electric inputs and electric outputs. The integrated circuit design also includes a plurality of layers of metalization for providing electric coupling. After the electronic integrated circuit design is selected, a predetermined number of optical input devices are located on the circuit cell design in a first prearranged orientation. The predetermined number of optical input devices is no greater than the predetermined number of electric inputs to the circuit cell. Also after the electronic circuit design is selected, a predetermined number of optical output devices are located on the circuit cell design in a second prearranged orientation. The predetermined number of optical output devices is no greater than the predetermined number of electric outputs to the circuit cell. At least a topmost layer of metalization is selected for electrically coupling each optical input device to a distinct one of the electric inputs of the circuit cell and for electrically coupling each optical output device to a distinct one of the electric outputs of the circuit cell. Finally, the completed design for the integrated circuit with optical inputs and outputs is recorded in a memory such as an electronic storage medium. The device may then be fabricated in accordance with the recorded design.

BRIEF DESCRIPTION OF THE DRAWINGS

FIG. 1A and 1B show a conventional smart pixel array.

FIG. 4 shows a cross-sectional view of the bonded contacts used to connect the photodetectors and modulators to the electronic integrated circuit.

DETAILED DESCRIPTION

Figure 2:
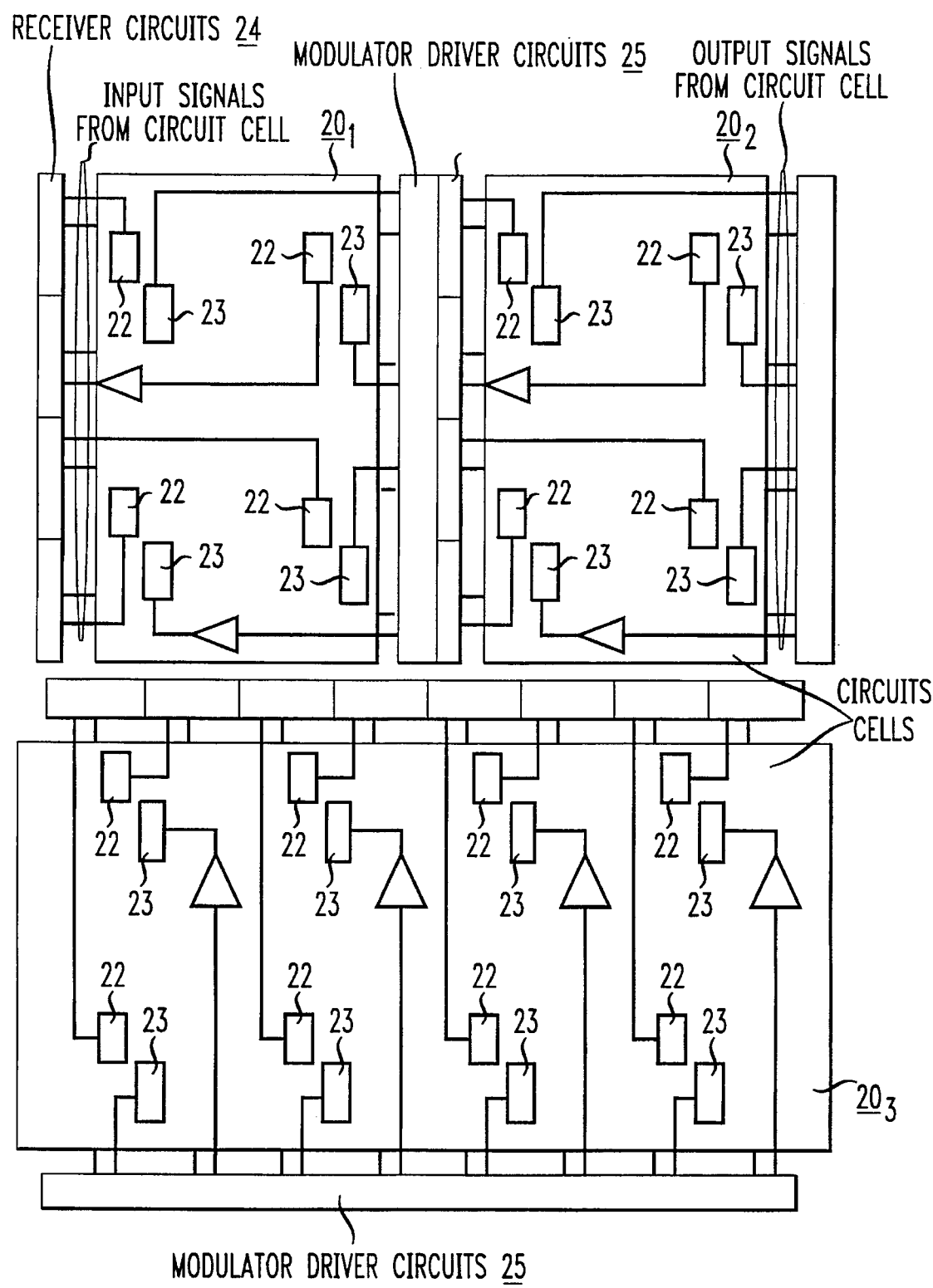
FIG. 2 shows a schematic diagram of an integrated circuit constructed in accordance with the present invention.

FIG. 2 shows a top view of an integrated circuit having optical I/Os constructed in accordance with the present invention. The exemplary integrated circuit contains three fully-fabricated electronic circuit cells $20_1$, $20_2$ and $20_3$ that each perform predefined electrical processes on electrical signals received at their inputs. In general, the integrated circuit may have any number of circuit cells $20_1$, $20_2$, . . . , $20_n$, or even a single circuit cell. In FIG. 2, the circuit cells $20_1$ and $20_2$ are illustratively shown with four input and four outputs while circuit cell $20_3$ is shown with eight inputs and eight outputs. Of course, the actual number of inputs and outputs will depend on the requirements of each particular circuit cell.

Each input of each circuit cell $20_1$, $20_2$ and $20_3$ receives an electrical input signal from an optical input comprising a photodetector 22 and a receiver circuit 24. Accordingly, circuit cells $20_1$ and $20_2$ are shown with four photodetector and receiver circuit pairs while circuit cell $20_3$ is shown with eight photodetector and receiver circuit pairs. Likewise, each output of each circuit cell $20_1$, $20_2$ and $20_3$ provides an electrical output signal to an optical output comprising a modulator 23 and a modulator driver circuit 25. Accordingly, circuit cells $20_1$ and $20_2$ are shown with four modulator and modulator driver circuit pairs while circuit cell $20_3$ is shown with eight modulator and modulator driver circuit pairs. In one embodiment of the invention, the photodetectors 22 and modulators 23 may be formed from p-i-n diodes such as Multiple Quantum Well (MQW) p-i-n diodes. The photodetectors 22 alternatively may be formed from silicon metal semiconductor metal (MSM) devices. Various combinations are also possible. For example, the photodetectors 22 may be formed from silicon diodes or MSM devices and the modulators 23 and modulator driver circuits 25 may be formed from Vertical Cavity Surface Emitting Lasers (VCSELs) and VCSEL driver circuits respectively. It should be noted that while the above description refers to the optical inputs and outputs as including the receiver circuit and the modulator driver circuit, respectively, these components may be alternatively associated with their respective electrical inputs and outputs. In this case the optical input refers only to the photodetector and the optical output refers only to the modulator.

In accordance with the present invention, the circuit cells constituting the entire electronic integrated circuit are first designed and optimized independently of and prior to the placement of the photodetectors and modulators on the integrated circuit. Optimization of the integrated circuit may involve the use of commercially available placement and routing tools that serve to minimize the area and maximize the clock frequency of the resulting integrated circuit. Accordingly, in contrast to conventional methods used to design smart pixels, the present invention places virtually no constraints on the integrated circuit design. As a result, the circuit cells constituting the integrated circuit may be highly complex and physically and functionally different from one another. Moreover, unlike the design of a smart pixel, the inventive method may be used with any of a wide variety of pre-existing high performance standard circuit cells, thus substantially reducing the amount of original electronic circuit design that must be performed. For example, standard cells may be selected from a commercially available library of circuit cells.

After the integrated circuit has been designed the location of the photodetectors and the modulators on the integrated circuit may be selected. As illustratively shown in FIG. 2, the photodetectors 22 and modulators 23 are typically arranged on the integrated circuit in a regular array. In particular, the photodetectors 22 and modulators 23 are illustratively shown as two interleaved grids. This regular pattern simplifies the optical system or systems required to transmit and receive the optical signals to and from the integrated circuit. In contrast to prior integrated circuits having optical I/Os such as the smart pixels discussed above, the inventive method allows the location of the photodetectors and the modulators on each circuit cell to be selected without regard to the symmetry of the underlying circuit cells. That is, a plurality of distinct circuit cells distributed over the integrated circuit in an asymmetric fashion may have optical I/Os that are collectively distributed in a symmetric arrangement which is dictated by the needs of the associated external optical system. This eliminates the need to completely redesign the integrated circuit for compatibility with optical I/Os. Moreover, the inventive method allows an integrated circuit having a given symmetric arrangement to be provided with photodetectors and modulators that are distributed with a different symmetric arrangement. In this case the photodetectors and modulators may or may not have the same symmetry. If the symmetry of the photodetectors and modulators are different from one another, one of them may even have the same symmetry as the integrated circuit.

The location of the receiver circuit 24 associated with each photodetector and the location of the modulator driver circuit 25 associated with each modulator also may be selected subsequent to designing the integrated circuit, based on considerations individual to each situation. In FIG. 2 for example, the receiver circuits and the modulator driver circuits are shown distributed about the periphery of their respective circuit cells. Alternatively, these circuits may be situated at any other appropriately selected location on their respective circuit cells. The manner in which the photodetectors, modulators, receiver circuits and modulator driver circuits are all electrically connected to one another and to the circuit cells will be discussed with reference to FIG. 3.

Figure 3:
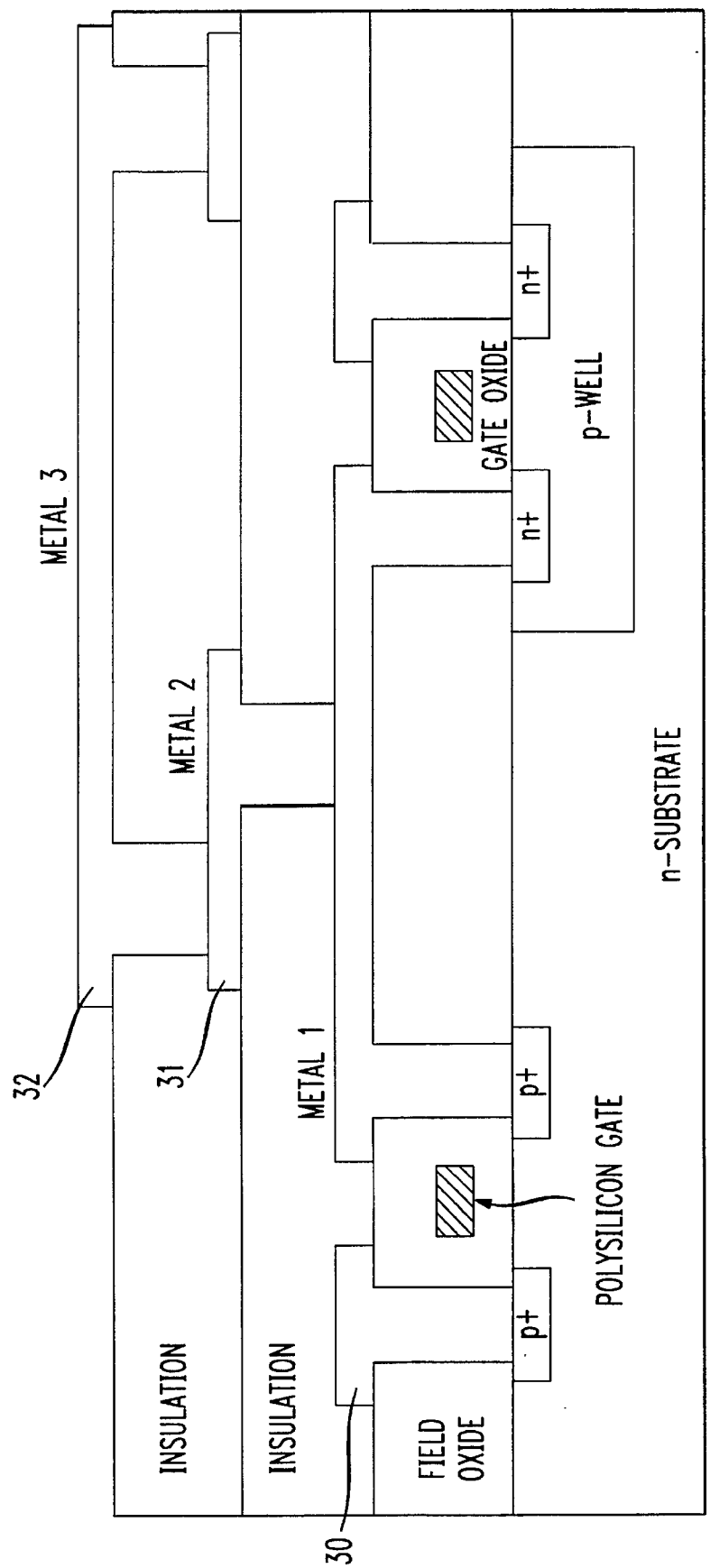
FIG. 3 shows a schematic cross-sectional view of an integrated circuit having three levels of metalization.

FIG. 3 shows a schematic cross-sectional view of a simplified integrated circuit. The exemplary integrated circuit includes a single inverter consisting of an n-MOS transistor and a p-MOS transistor. Electrical interconnections in conventional integrated circuits, particularly in VLSI circuits, are often formed from a multilevel metalization scheme to provide additional surface area on which interconnections can be made and to provide additional flexibility in circuit layout. In the illustrative integrated circuit shown in FIG. 3 three layers 30, 31 and 32 of metalization are employed which are separated from one another by insulator layers. Most commercial integrated circuit fabrication processes allow for the provision of at least three layers of metalization. However, most integrated circuits can be satisfactorily laid out and interconnected with only two layers of metalization. In fact, most current standard integrated circuit designs employ only two levels of metalization. In some cases only one layer of metalization is employed. Therefore, in accordance with the present invention, the topmost layer of metalization (which is commonly the third layer in many commercial silicon VLSI fabrication processes) can be reserved for bonding the photodetectors, modulators, receiver circuits and modulator driver circuits to the circuit cells and for interconnecting them to one another. That is, the topmost layer of metalization can be used to electrically couple the photodetectors to their respective receiver circuits and the receiver circuits to their respective electric inputs of the circuit cells. Similarly, the topmost layer of metalization also can be used to electrically couple the modulators to their respective modulator driver circuits and the modulator driver circuits to their respective electric outputs of the circuit cells. In some situations it may be convenient to reserve more than one level of metalization for the optical I/Os. In this case the topmost level can be used to bond and interconnect the I/O components and the remaining reserved levels of metalization can be used to form additional interconnections between the I/O components. Furthermore, the absolute placement of the arrays of optical inputs and outputs can be optimized to minimize interconnection lengths to the respective receiver circuits and modulator driver circuits. If necessary, an integrated circuit design that employs all available layers of metalization can be easily redesigned so that the topmost level is reserved for the optical I/Os.

After the integrated circuit with its optical I/Os has been designed, fabrication may proceed in accordance with a technique disclosed in U.S. Pat. No. 5,385,632 for example, which is hereby incorporated by reference. In summary, this technique first requires that the integrated circuit be fully fabricated in a conventional manner. Similarly, the optical I/Os are fully fabricated on a single substrate independently of the fabrication of the integrated circuit. The photodetectors and the modulators are arranged on the substrate in the array which was selected during the design process. The substrate containing the optical I/Os is then placed over the integrated circuit and properly aligned so that each photodetector and modulator is situated over its predetermined location on the integrated circuit selected during the design process. The optical I/Os are then physically connected to the topmost level of metalization via bonded contacts as detailed in U.S. Pat. No. 5,385,632. The bonding technique disclosed in this reference allows the photodetectors and modulators to be bonded anywhere on the individual circuit cells, including locations directly over active electronic circuitry.

The following discussion provides some additional details of the fabrication technique disclosed in the previously-referenced patent that has been used in connection with the inventive method. A fully-fabricated electronic integrated circuit was mounted onto a photoresist spinner chuck in order to apply a photoresist such as a 7 mm-thick film of Shipley 1075 photoresist, for example. The integrated circuit was mounted on a larger substrate of glass or silicon. Additional silicon material surrounded and contacted the integrated circuit to prevent a thick meniscus of photoresist from building up at its edges while spinning. This meniscus of photoresist could make subsequent alignment between the integrated circuit and the photomask extremely difficult.

The photoresist was soft cured on a hot plate at 110° C. for 180 seconds after which the integrated circuit was removed from the larger substrate and placed in a mask aligner. The photoresist was exposed through a photomask having a pattern corresponding to the preselected sites of the bonded contacts. The integrated circuit was then developed to remove the photoresist from the preselected sites.

A tri-level film of titanium, nickel, and gold was then evaporated onto the integrated circuit. The films can have a thickness ranging from about 25–500 Å for titanium, 50–2000 Å for nickel, and 500–2000 Å for gold. While this particular choice of metals is well know to those of skill in the art, these thicknesses are much less than are conventionally employed. Thinner films may used in the present invention because the area over which the bonded contacts extend is much smaller than is typically employed. The integrated circuit is next immersed in a bath of acetone to dissolve the remaining photoresist, thereby removing the metal above it. Optionally, a 3–4 mm-thick film of solder such as lead-tin solder or pure indium solder, for example, may be deposited prior to immersion in the acetone. The solder is removed with the other metal layers when the photoresist is dissolved. FIG. 4 shows the resulting structure after this procedure has been completed.

Independently of the procedure delineated above, the optical I/Os were fully fabricated by a conventional method on a single substrate to form an optical integrated circuit. This circuit was then ready to be bonded onto the bonded contacts described above. First, the electrical and optical integrated circuits were mounted onto heated vacuum chucks and aligned by a commercially available flip-chip bonder. The integrated circuits were heated to 60° C. and brought into contact with one other with a force of 50–100 grams. The requisite force will in general depend on the total area of the bonded contacts. The force was maintained while the integrated circuits were heated to 140–200° C. This temperature will in general depend on the ratio of lead to tin in the solder and may range up to 300° C. Once the desired temperature was reached, the force was maintained for 60–120 seconds, after which the optical integrated circuit was released from its vacuum chuck. The completed structure was cooled to 60° C. and removed from the bonder. Additional details concerning the fabrication process such as the removal of the substrate from the optical integrated circuit can be found in U.S. Pat. No. 5,385,632.

In one example of the invention, a circuit cell was fabricated that consisted of an array of First-In First-Out (Fifo) memory buffers. The circuit cell was of a conventional design having sub-components selected from among a library of conventional designs. The array had 64 electrical inputs and 64 electrical outputs and each buffer had 32 bits of memory. In accordance with the inventive method, 32 of the electrical inputs and outputs were provided with optical I/Os. The Fifo was implemented in a conventional 0.8 micron CMOS process. The interconnections for the electrical components within the Fifo circuit cell were all located within only two levels of metal. The third, topmost level of metal was used solely for connecting the optical I/Os to the circuit cell in the manner described above. The 32 receiver circuits were arranged in a linear array along the bottom periphery near the electrical inputs. Similarly, the 32 modulator driver circuits were arranged in a linear array along the top periphery near the electrical outputs. The photodetectors and modulators were arranged in regular arrays. Specifically, the photodetectors were arranged in a grid with four equally spaced columns of photodetectors and eight equally spaced rows of photodetectors. The modulators were arranged in a grid with sixteen equally spaced columns of modulators and two equally spaced rows of modulators. The photodetectors and modulators were fabricated from identical multiple quantum well (MQW) devices appropriately biased for each task.

The optical performance of the Fifo data-buffer circuit was tested using one laser diode serving as an optical input source and another laser diode serving as an optical readout beam to be modulated by the modulators. Operation of the Fifo involved shifting bits through all 32 of its shift registers. Thirty-two bits of data were loaded into one electrical input of the Fifo by modulating the input laser diode. The data was then shifted through the corresponding Fifo buffer and transferred to the electrical output while the intensity modulation of the optical readout beam was monitored. These tests confirmed that satisfactory electrical and optical performance of the Fifo was achieved.

We claim:

1. A method comprising the steps of:
   (a) selecting an electronic integrated circuit design having at least one circuit cell design for processing electric signals, said circuit cell design having a number of electric inputs and electric outputs, said integrated circuit design further including a plurality of layers of metalization for providing electric coupling;
   (b) subsequent to step (a), locating a number of optical input devices on the circuit cell design in a first orientation, the number of optical input devices being no greater than the number of electric inputs to the circuit cell;
   (c) subsequent to step (a), locating a number of optical output devices on the circuit cell design in a second orientation, the number of optical output devices being no greater than the number of electric outputs to the circuit cell;
   (d) selecting at least a topmost layer of metalization for electrically coupling each optical input device to a distinct one of said electric inputs of the circuit cell and for electrically coupling each optical output device to a distinct one of said electric outputs of the circuit cell;
   (e) fabricating an integrated circuit with optical inputs and outputs in accordance with steps (a)–(d).

2. The method of claim 1 wherein the optical input devices each comprise a photodetector for convening an optical input signal to a photocurrent and a receiver circuit coupled to said photodetector for converting said photocurrent to an electric input signal.

3. The method of claim 2 wherein the optical output devices each comprise a modulator driver circuit for converting an electric output signal to a voltage signal and a modulator coupled to said modulator driver circuit for converting said voltage signal to an optical output signal.

4. The method of claim 1 wherein said first and second orientations form regular arrays.

5. The method of claim 1 wherein said electronic integrated circuit design includes a plurality of circuit cell designs, and further comprising the steps of repeating steps (b)–(d) for each of the circuit cells designs.

6. The method of claim 5 wherein said plurality of circuit cell designs form a spatially asymmetric electronic integrated circuit designs and wherein said first orientations for the circuit cell designs form a first common symmetric arrangement and said second orientations for the circuit cells form a second common symmetric arrangement.

7. The method of claim 1 wherein said plurality of layers of metalization comprise three layers of metalization.

8. The method of claim 1 wherein said selecting step comprises the step of selecting a standard electronic integrated circuit design from among a library of electronic integrated circuit designs.

9. The method of claim 1 wherein each of said electric inputs includes a receiver circuit for converting a photocurrent to an electric input signal and each of said electric outputs includes a modulator driver circuit for converting an electric output signal to a voltage signal.

10. The method of claim 9 wherein said optical input devices comprise a photodetector and said optical output devices comprise a modulator.

11. The method of claim 1 wherein the step of selecting an electronic integrated circuit design comprises the step of optimizing the integrated circuit design independent of performing steps (b) and (c).

12. The method of claim 11 wherein the optimization step comprises the step of optimizing at least one characteristic selected from the group consisting of the area of the integrated circuit, the clock frequency of the circuit cell, and the power dissipation of the circuit cell.

13. The method of claim 9 wherein said receiver circuits and said modulator driver circuits are located along a periphery of the circuit cell.

14. The method of claim 10 wherein the fabricating step comprises the steps of:
   fully fabricating the electronic integrated circuit;
   fully fabricated the number of optical input devices and optical output devices on a common substrate to form a fully fabricated optical integrated circuit;
   aligning said fully fabricated optical integrated circuit over said fully fabricated electronic integrated so that each of the optical input devices and optical output devices are situated over a location on the electronic integrated circuit;
   bonding said fully fabricated electronic integrated circuit to said fully fabricated optical integrated circuit.

15. The method of claim 14 further comprising the steps of:

bonding at least one optical input device to a location on the fully fabricated electronic integrated circuit situated over active electronic circuitry.

16. The method of claim 14 further comprising the steps of:

bonding at least one optical output device to a location on the fully fabricated electronic integrated circuit situated over active electronic circuitry.

17. The method of claim 1 wherein said circuit cell design is a pixel design.

18. The method of claim 1 wherein said circuit cell design is a First-In First-Out memory buffer design.

19. The method of claim 10 wherein said photodetectors and said modulators are multiple quantum well p-i-n diodes.

20. The method of claim 10 wherein said photodetectors are multiple quantum well p-i-n diodes and said modulators are vertical cavity surface emitting lasers.

21. The method of claim 10 wherein said photodetectors are silicon diodes and said modulators are multiple quantum well p-i-n diodes.

22. The method of claim 10 wherein said photodetectors are metal-semiconductor-metal devices and said modulators are vertical cavity surface emitting lasers.

23. The method of claim 10 wherein said photodetectors are metal-semiconductormetal devices and said modulators are multiple quantum well p-i-n diodes.

24. A method comprising the steps of:

(a) selecting an electronic integrated circuit design having a plurality of circuit cell designs for processing electric signals, said circuit cell designs being different from one another such that the electronic integrated circuit is asymmetrically distributed over its surface, said integrated circuit having a number of electric inputs and electric outputs and including a plurality of layers of metalization for providing electric coupling;

(b) locating a number of optical input devices on the plurality of circuit cell designs in a first symmetric arrangement, the number of optical input devices being no greater than the number of electric inputs to the electronic integrated circuit;

(c) locating a number of optical output devices on the plurality of circuit cell designs in a second symmetric orientation, the number of optical output devices being no greater than the number of electric outputs to the electronic integrated circuit;

(d) selecting at least a topmost layer of metalization for electrically coupling each optical input device to a distinct one of said electric inputs of the electronic integrated circuit and for electrically coupling each optical output device to a distinct one of said electric outputs of the electronic integrated circuit;

(e) fabricating an integrated circuit with optical inputs and outputs in accordance with steps (a)–(d).

25. A method comprising the steps of:

(a) selecting an electronic integrated circuit design having at least one circuit cell design for processing electric signals, said circuit cell design having a number of electric inputs and electric outputs, said integrated circuit design further including a plurality of layers of metalization for providing electric coupling;

(b) subsequent to step (a), locating a number of optical input devices on the circuit cell design in a first orientation, the number of optical input devices being no greater than the number of electric inputs to the circuit cell;

(c) subsequent to step (a), locating a number of optical output devices on the circuit cell design in a second orientation, the number of optical output devices being no greater than the number of electric outputs to the circuit cell;

(d) selecting at least a topmost layer of metalization for electrically coupling each optical input device to a distinct one of said electric inputs of the circuit cell and for electrically coupling each optical output device to a distinct one of said electric outputs of the circuit cell;

(e) recording in a memory a design for an integrated circuit with optical inputs and outputs in accordance with steps (a)–(d).

* * * * *